(12) United States Patent
Edwards et al.

(10) Patent No.: US 7,328,508 B2
(45) Date of Patent: Feb. 12, 2008

(54) ANISOTROPIC HEAT SPREADING APPARATUS AND METHOD FOR SEMICONDUCTOR DEVICES

(75) Inventors: David L. Edwards, Poughkeepsie, NY (US); Thomas Fleischman, Poughkeepsie, NY (US); Paul A. Zucco, Saugerties, NY (US)

(73) Assignee: International Business Machines Corporation, Armonk, NY ( * ) Notice: Subject to any disclaimer, the term of this patent is extended or adjusted under 35 U.S.C. 154(b) by 351 days.

(21) Appl. No.: 11/160,665

(22) Filed: Jul. 5, 2005

(65) Prior Publication Data
US 2007/0009687 A1    Jan. 11, 2007

(51) Int. Cl.
*B21D 51/16*    (2006.01)
*B28B 1/00*    (2006.01)

(52) U.S. Cl. .............. 29/890.03; 29/422; 264/464; 264/642

(58) Field of Classification Search .......... 438/54, 438/63, 122, 438; 106/601, 18.12, 605, 604; 428/613, 620; 29/422, 890.03; 264/464, 264/642
See application file for complete search history.

(56) References Cited

U.S. PATENT DOCUMENTS

| 5,498,462 A * | 3/1996 | Darfler .................. 428/116 |
| 6,706,562 B2 | 3/2004 | Mahajan et al. |
| 2004/0118501 A1* | 6/2004 | Chiu et al. .................. 156/64 |
| 2004/0184241 A1 | 9/2004 | DeLorenzo et al. |
| 2004/0266056 A1 | 12/2004 | Ravi et al. |

* cited by examiner

*Primary Examiner*—D. Lawrence Tarazano
*Assistant Examiner*—Lauren E Robinson
(74) *Attorney, Agent, or Firm*—Cantor Colburn LLP; Joseph Petrokaitis

(57) ABSTRACT

A heat spreading apparatus for use in cooling of semiconductor devices includes a frame having a plurality of individual cells formed therein, each of the cells configured for filling with a material of selected thermal conductivity therein. The selected thermal conductivity of material within a given one of the cells corresponds to a thermal profile of the semiconductor device to be cooled.

5 Claims, 6 Drawing Sheets

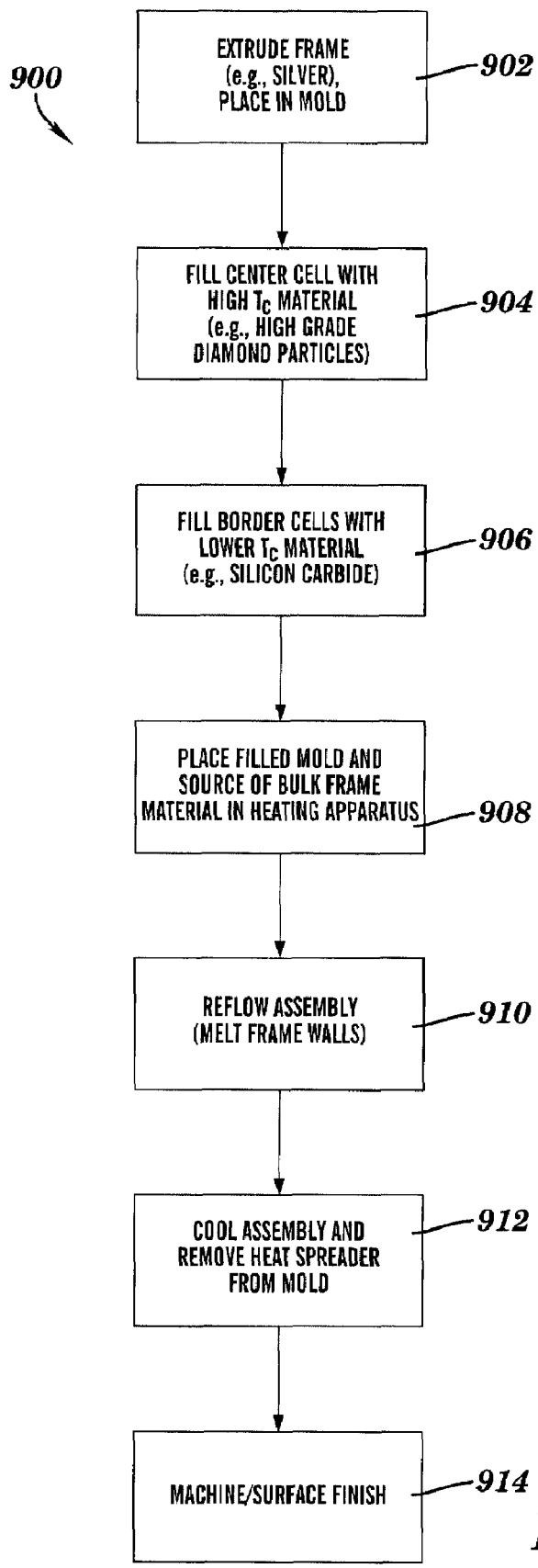
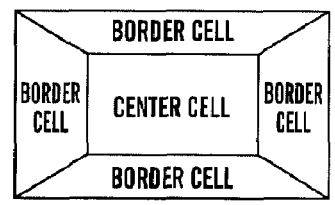
FIG. 9(b)
FIG. 9(a)

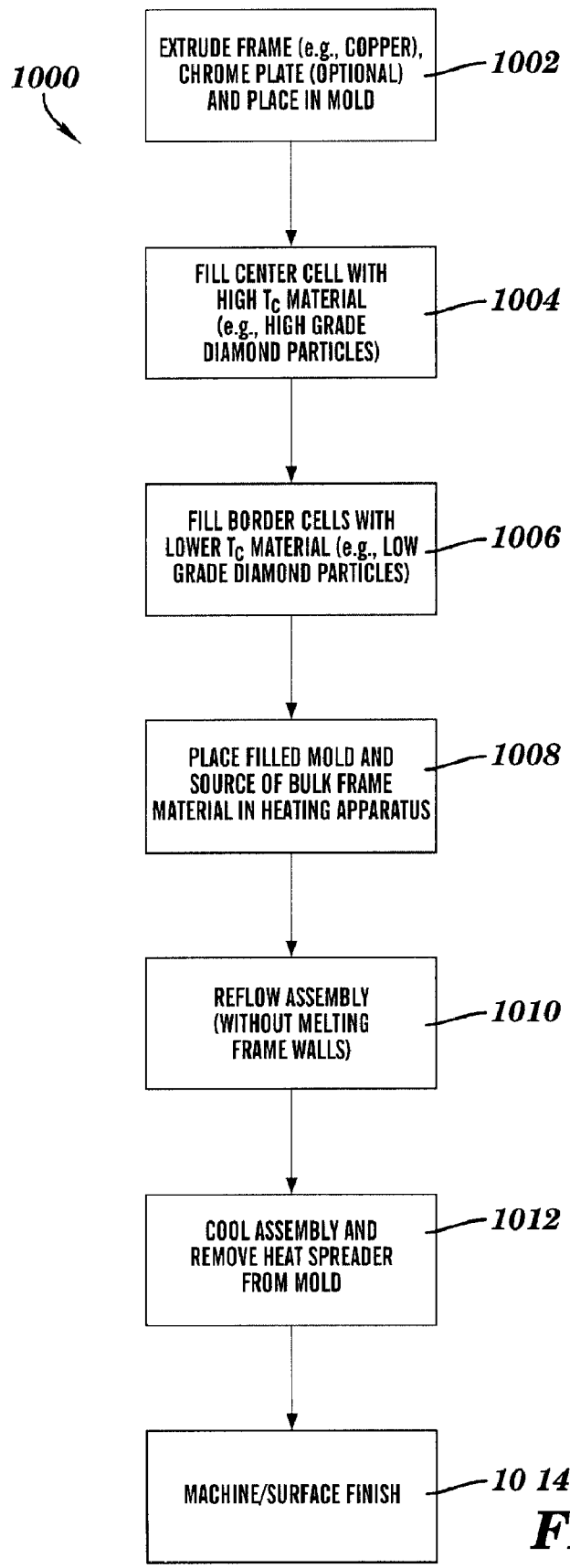
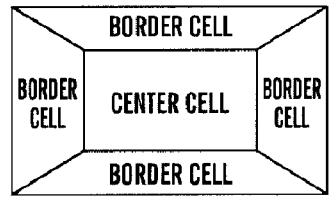
*FIG. 10(b)*
*FIG. 10(a)*

ANISOTROPIC HEAT SPREADING APPARATUS AND METHOD FOR SEMICONDUCTOR DEVICES

BACKGROUND

The present invention relates generally to integrated circuit heat dissipation devices, and, more particularly, to an anisotropic heat spreading apparatus and method for semiconductor devices.

The semiconductor industry has seen tremendous technological advances in recent years that have permitted dramatic increases in circuit density and complexity, as well as equally dramatic decreases in power consumption and package sizes. Present semiconductor technology now permits single-chip microprocessors with many millions of transistors, operating at speeds of tens (or even hundreds) of MIPS (millions of instructions per second), to be packaged in relatively small, air-cooled semiconductor device packages. Because integrated circuit devices, microprocessors and other related components are designed with increased capabilities and increased speed, additional heat is generated from these components.

As packaged units and integrated circuit die sizes shrink, the amount of heat energy given off by a component for a given unit of surface area is also on the rise. The majority of the heat generated by a component, such as a microprocessor for example, must be removed from the component in order to keep the component at an acceptable or target operating temperature. If the heat generated is not removed from the component, the heat produced can drive the temperature of the component to levels that result in early failure of the component. In some instances, the full capability of certain components cannot be realized since the heat the component generates at the full capability would result in failure of the component.

An integrated circuit has a front side and a backside. The front side of the integrated circuit includes leads for inputs, outputs and power to the integrated circuit. Leads include many forms, including pins and balls in a ball grid array. The leads of an integrated circuit are attached to pads on another device such as a printed circuit board. For example, an integrated circuit that includes a die having a microprocessor therein has a front side that is attached to the pads on a motherboard, substrate or leadframe. In contrast, a heat sink is attached to the backside of the integrated circuit, extending away from the printed circuit board to which the integrated circuit is mounted. Accordingly, a major portion of the heat generated is generally extracted from the backside of the integrated circuit with the die therein.

There is a practical limitation on the amount of heat that can be extracted from the backside of the integrated circuit die, as a result of the thermal resistance of the thermal interface materials (such as any thermal grease, adhesives or solders) used between the backside of the integrated circuit die and the heat sink. Typically, heat sinks are formed from materials such as copper or aluminum and have a limited ability to conduct heat. Relatively large fin structures are also provided to increase the amount of heat removed via conduction. Fans are also provided to move air over the fin structures to aid in the removal of heat. Increasing the size of the fin structure increases the volume of the heat sink, and generally also increases the stack height of the heat sink. In many electronic devices, the overall size of the heat sink is generally limited by volume constraints of the housing. For example, in some mobile products such as laptop computers and ultra-mobile computers, small stack heights are required.

The use of aluminum and copper heat sinks with fin structures are now therefore approaching their practical limits for removal of heat from a high performance integrated circuit, such as the integrated circuits that include dies for microprocessors. When heat is not effectively dissipated, the dies develop "hot spots" (i.e., areas of localized overheating). Unfortunately, the current cost performance lids do not adequately solve this heat dissipation/distribution problem. Moreover, the existing lid materials are isotropic, in that they provide singular heat flow characteristics derived from the intrinsic homogeneous properties of the lid material. In some instances, traditional aluminum and copper heat sinks have been replaced with sinks incorporating exotic materials (e.g., diamond particles) therein. However, diamond heat sinks are difficult to manufacture, in addition to being expensive. In particular, one aspect of diamond heat sink formation is that one major surface of the heat sink must be ground smooth in order to provide a good thermal connection at a thermal interface. The grinding or smoothing of diamond is also time consuming.

In view of the above, it would be desirable to be able to provide a heat spreading apparatus and methodology for semiconductor devices in a manner that is both efficient and cost effective.

SUMMARY

The foregoing discussed drawbacks and deficiencies of the prior art are overcome or alleviated by a heat spreading apparatus for use in cooling of semiconductor devices. In an exemplary embodiment, the heat spreading apparatus includes a frame having a plurality of individual cells formed therein, each of the cells configured for filling with a material of selected thermal conductivity therein. The selected thermal conductivity of material within a given one of the cells corresponds to a thermal profile of the semiconductor device to be cooled.

In another embodiment, a method for forming a heat spreading apparatus for semiconductor includes extruding a frame material to form a plurality of individual cells, filling a first group of the individual cells with one or more high thermal conductivity materials, and filling at least a second plurality of the individual cells with one or more materials of lower thermal conductivity than in the first plurality of cells.

BRIEF DESCRIPTION OF THE DRAWINGS

Referring to the exemplary drawings wherein like elements are numbered alike in the several Figures:

FIG. 9 is a flow diagram illustrating a method for forming a heat spreading apparatus, in accordance with a further embodiment of the invention; and FIG. 10 is a flow diagram illustrating an alternative embodiment of the method shown in FIG. 9.

DETAILED DESCRIPTION

Disclosed herein is a cost/performance heat spreading apparatus and method that provides tailored thermal conduction properties of selective areas of the apparatus to correspond to determined hot spots on a chip. Briefly stated, the heat spreading apparatus incorporates anisotropic properties to address the varying heat transfer requirements of a semiconductor chip, while a web (e.g., honeycomb) of high strength material included in the heat spreading apparatus provides the skeleton thereof with sufficient strength to be used in mechanically loaded applications, such as land grid array (LGA) applications.

Moreover, the present solution allows high thermal conductivity ($T_c$) materials, such as diamond particles in a polymer matrix, to specifically contact the hot spots of a chip, while higher strength, less thermally conductive materials may be used to fill the honeycomb cells where the desired heat transfer is less significant. By specifically tailoring the material that each of the honeycomb cells are filled with, more expensive, high heat transfer materials can be provided only where desired in specific locations, thus saving the cost of fabricating a lid entirely with more expensive materials (such as diamond, for example).

Figure 1:
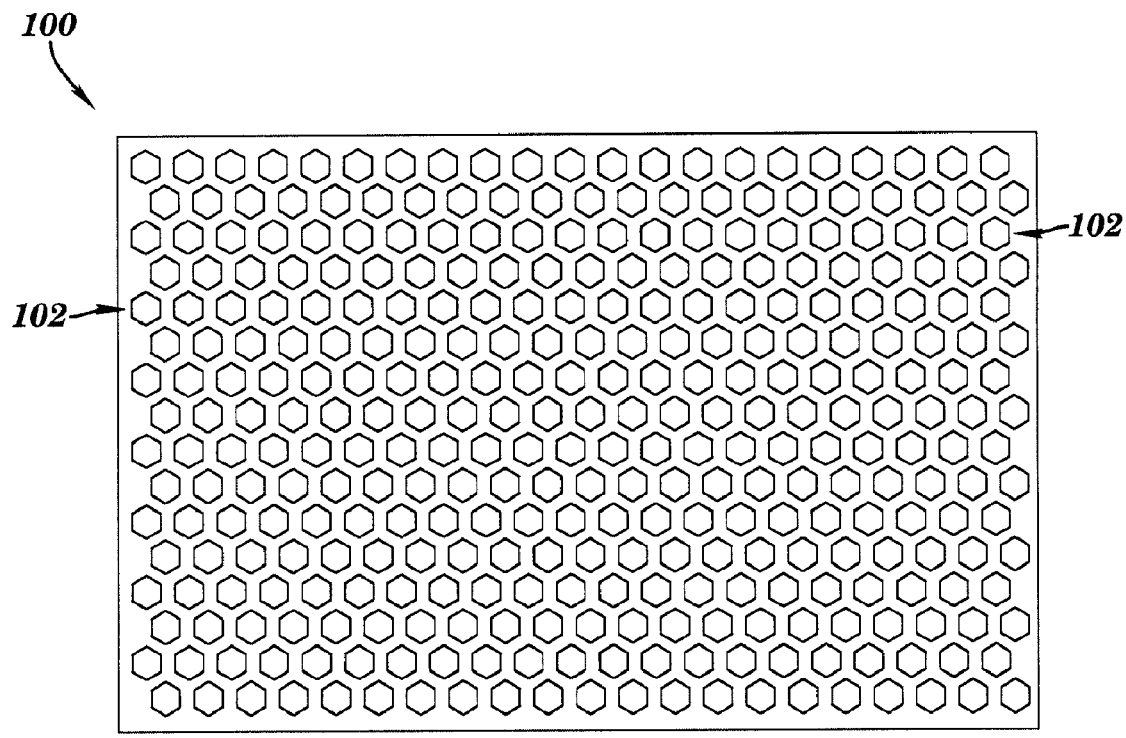
FIG. 1 is a top, cross sectional view of the structure of a heat spreading apparatus, in accordance with an embodiment of the invention.

Referring now to FIG. 1, there is shown a top, cross sectional view of the structure of a heat spreading apparatus 100, in accordance with an embodiment of the invention. As is shown, the heat spreading apparatus 100 includes a web of individual cells 102 that may be filled with materials of various thermal properties. In the embodiment depicted, the web is shown a "honeycomb-like" design of individual hexagonal cells. However, other shapes and designs of cell configurations are also contemplated including, but not limited to, packed arrangements such as circular type cell shapes (e.g., circle, oval, elliptical, etc.) and polygonal type cell shapes having three or more sides, as well as cells of varying sizes. Exemplary materials that may be used to form the sidewall, top and bottom surfaces of the cells 102 include, but are not limited to, metals (e.g., aluminum, copper), thermoplastics and plated materials. The web can further be extruded, molded, machined and the like, depending on the particular material or materials used in forming the same. It should be further noted that in the exemplary embodiment of FIG. 1, the thickness of the cell walls are not necessarily to scale, and are exaggerated for illustrative purposes.

Figure 2:
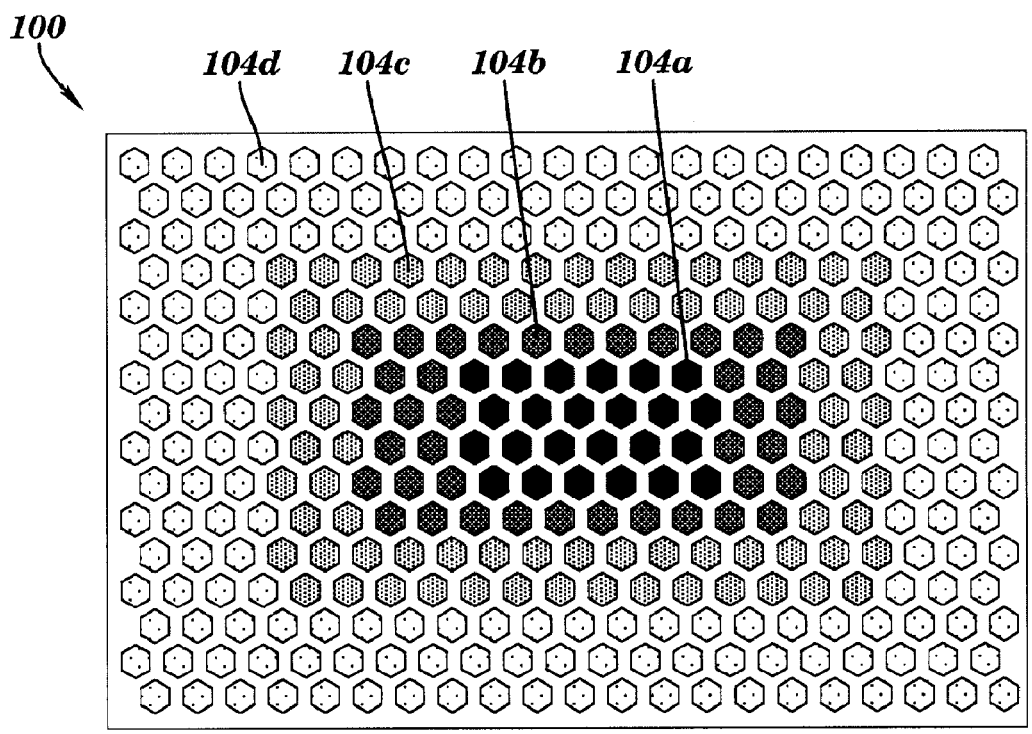
FIG. 2 illustrates one specific example of the heat spreading apparatus of FIG. 1, following the fill of the individual cells with various thermal spreading materials.

FIG. 2 illustrates one specific example of the heat spreading apparatus 100 of FIG. 1, following the fill of the individual cells 102 with various thermal spreading materials used therein. In the example depicted, a first group of cells 102 has a first fill material 104*a* formed therein, a second group of cells 102 has a second fill material 104*b* formed therein, a third group of cells 102 has a third fill material 104*c* formed therein, and a fourth group of cells 102 has a fourth fill material 104*d* formed therein. Further, in the example depicted, the chip (not shown) to which the heat spreading apparatus 100 is to be attached is determined to have the hottest spots in the center thereof, with the cooling requirements being decreased in a generally rectangular pattern away from the center. Accordingly, for an economical yet effective heat transfer apparatus 100, the first cell material 104*a* (darkest shading) may be a high $T_c$, higher cost material such as diamond, silicon carbide or aluminum silicon carbide, for example. For the cells corresponding to somewhat cooler spots on the chip, the second and third cell materials 104*b*, 104*c* (intermediate shadings) may be medium cost, medium $T_c$ materials. Finally, for the peripheral areas of apparatus 100 corresponding to the coolest spots on the chip, the fourth cell material 104*d* (lightest shading) may be a low cost, low $T_c$ material.

Figure 3:
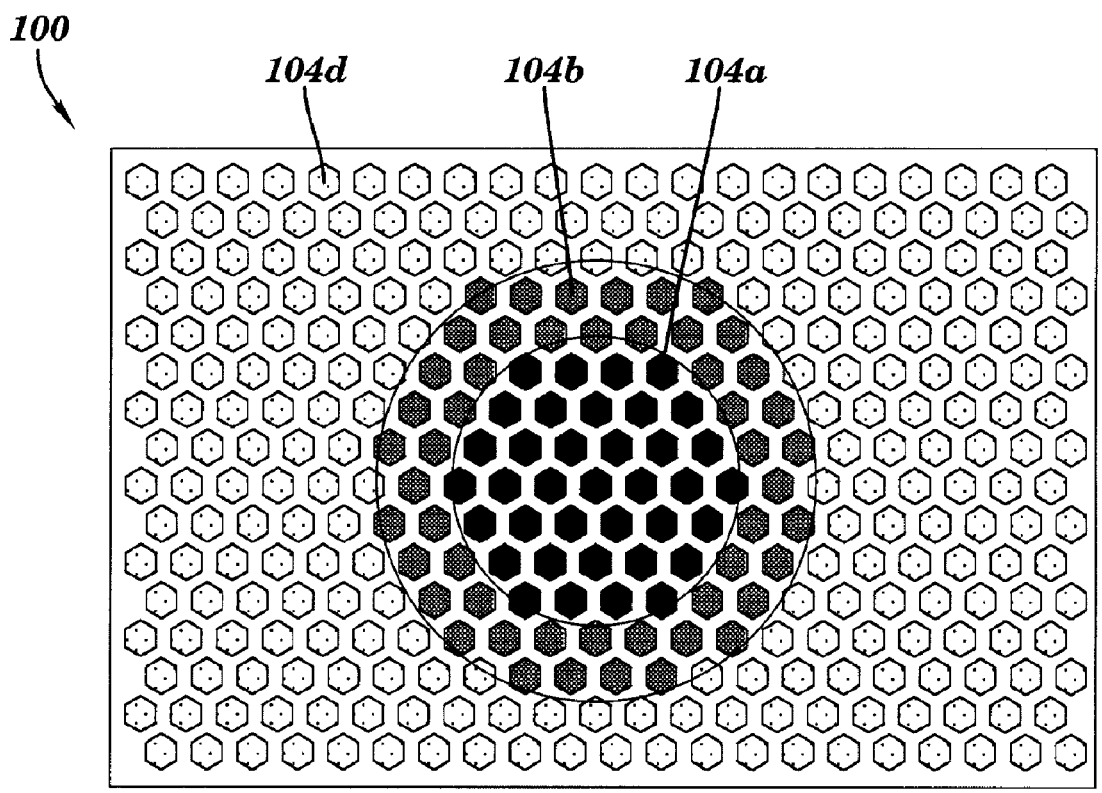
FIG. 3 illustrates an alternative embodiment of the fill pattern of the heat spreading apparatus.
Figure 4:
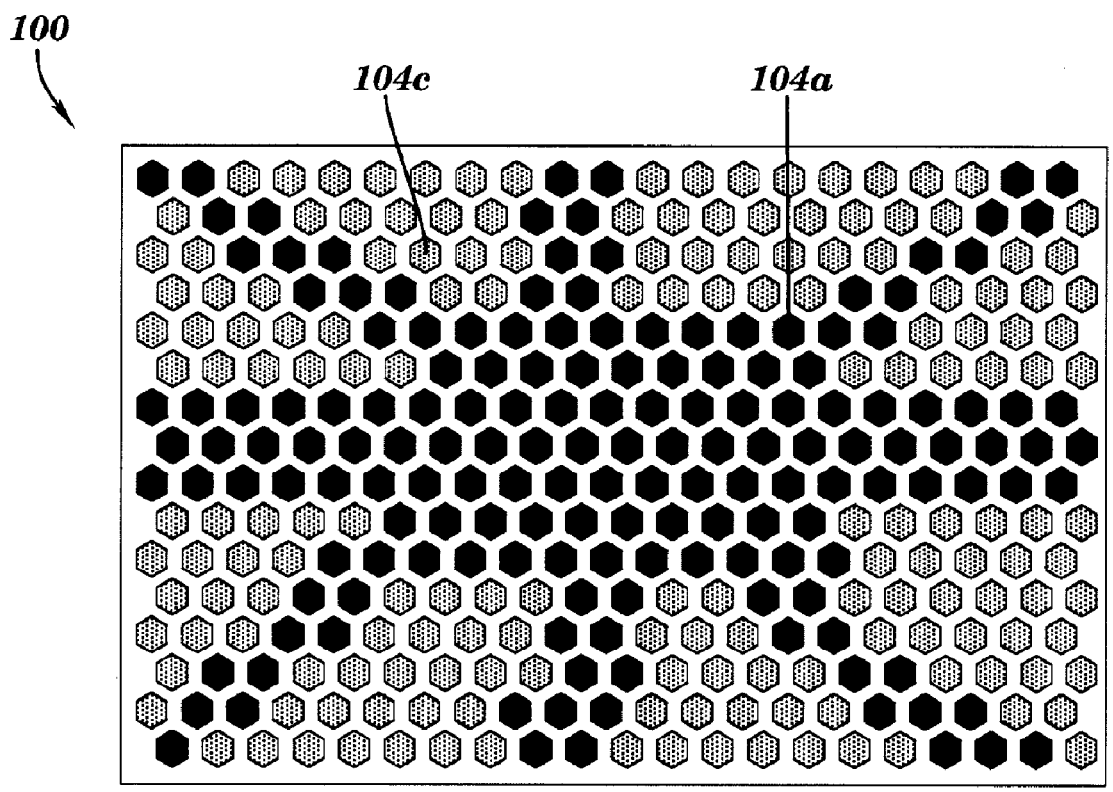
FIG. 4 illustrates another alternative embodiment of the fill pattern of the heat spreading apparatus.
Figure 5:
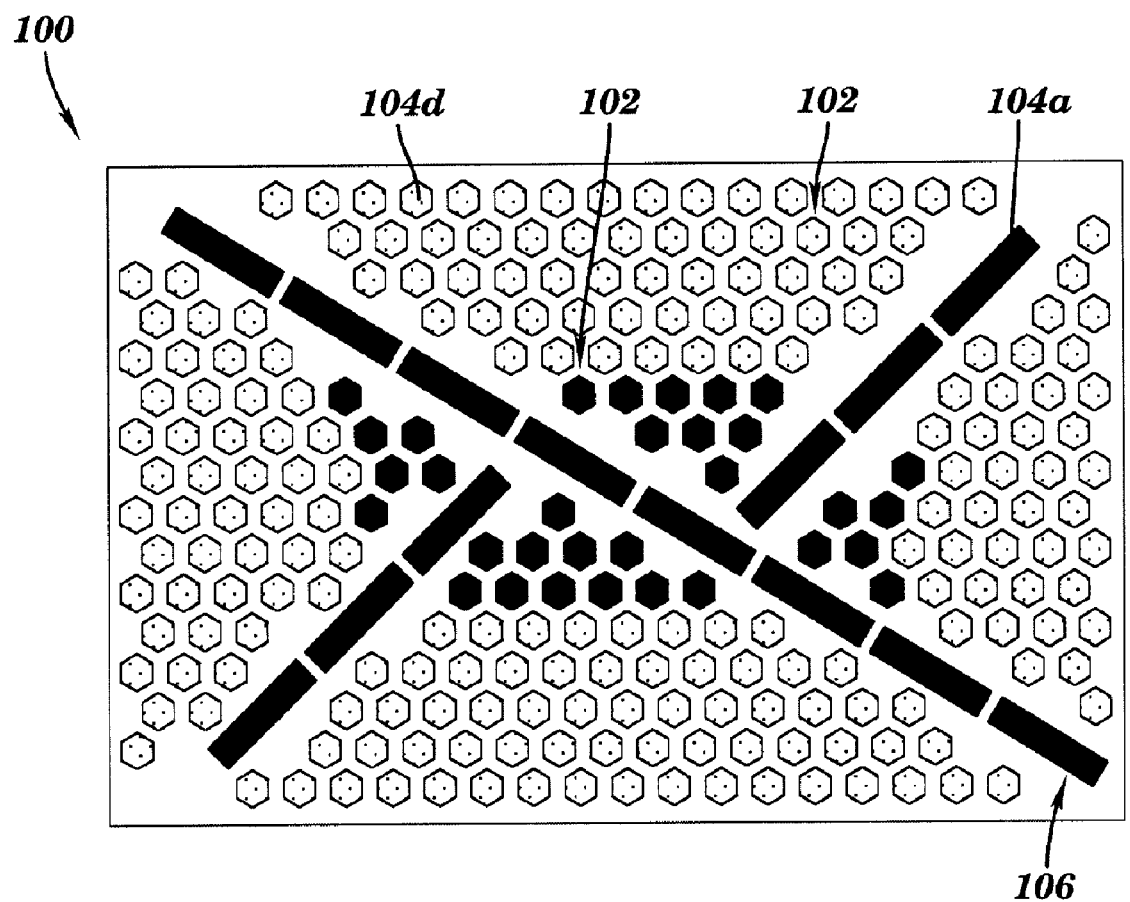
FIG. 5 illustrates still another alternative embodiment of the fill pattern of the heat spreading apparatus.

FIG. 3 illustrates an alternative embodiment of the heat spreading apparatus 100, wherein the pattern of cell fill materials varies in a circularly outward pattern, again with the higher $T_c$/cost fill material 104*a* being located in the centermost cells. In FIG. 4, a "sunburst" pattern of high $T_c$ fill material 104*a* is defined within the heat spreading apparatus 100. Again, several different patterns of differing fill materials are contemplated, depending on a specific thermal profile and mechanical needs of the chip to which the apparatus 100 is intended to be attached. FIG. 5 illustrates still an alternative embodiment of the heat spreading apparatus 100, having cell patterns of both different fill materials and different shapes. For example, the heat spreading apparatus 100 can have cells 102 of a first size and shape (such as small hexagonal or circular cells), as well as cells 106 of a second size and shape (such as larger rectangular cells). Thus configured, the heat spreading apparatus 100 can optimize thermal spreading, strength of the structure (for retention hardware forces where applicable), and heat dissipation of specific chip hot spots.

As indicated above, the individual cells 102 of the heat spreading apparatus 100 may be filled with a variety of different materials to create anisotropic thermal conduction properties across the entire structure in the z (as well as the planar x-y) directions. To this end, thermoplastics and thermosets may be compounded with industrial diamond particles, graphite, liquid metals, water or phase change materials. In essence, the cells 102 may be filled (either fully or partially) with any material that provides the desired thermal and mechanical properties in the chip location specified.

Figure 6:
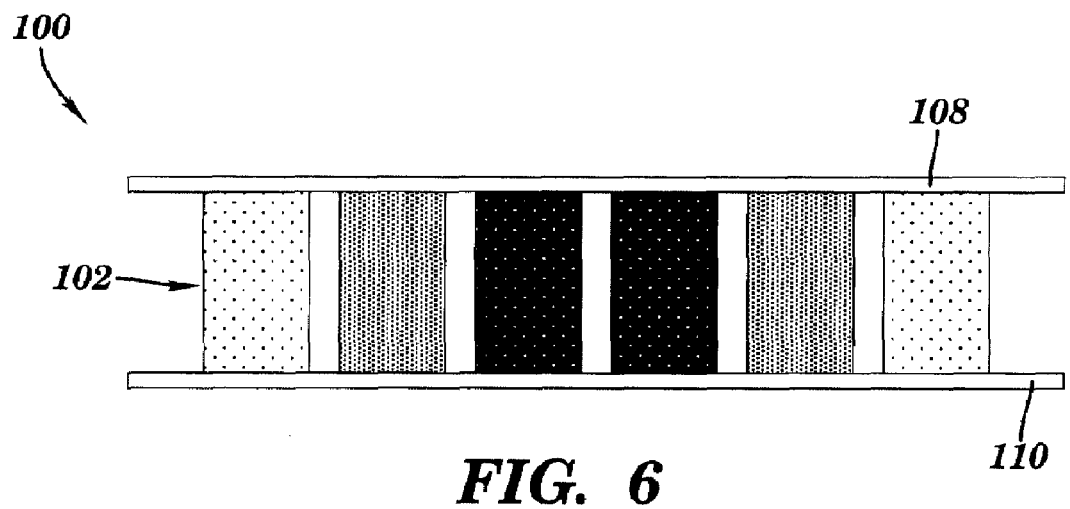
FIGS. 6-8 illustrate partial, side cross sectional views of various additional embodiments of the heat spreading apparatus.
Figure 7:
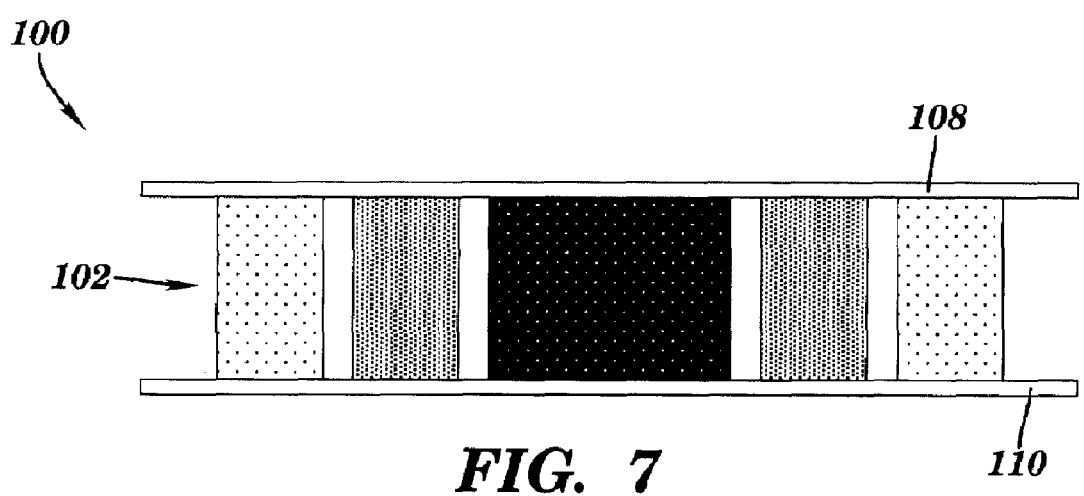
Figure 8:
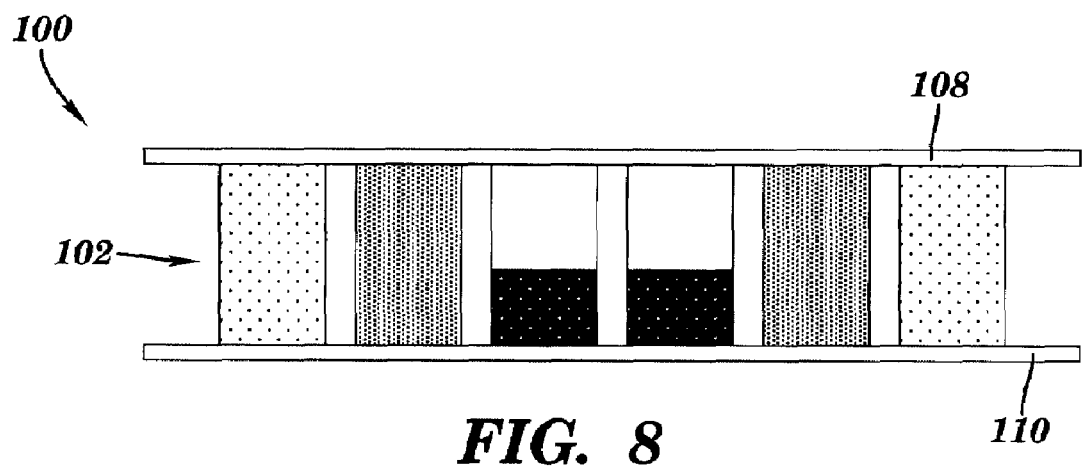

FIGS. 6-8 illustrate partial, side cross sectional views of various additional embodiments of the heat spreading apparatus 100. For instance, in FIG. 6, it can be seen that the higher $T_c$ fill materials 104*a* are used in the center cells, while the intermediate and lower $T_c$ fill materials 104*c*, 104*d* are used in the middle and outer perimeter cells, respectively. As is further illustrated, the heat spreading apparatus 100 may include a top surface 108 and a bottom surface 110 for providing an enhanced thermal interface to a heat sink and chip, as well as to encapsulate the filler material(s) used within the cells. FIG. 7 once again illustrates that the cells may have different shapes and/or sizes with respect to one another. As further shown in FIG. 8, one or more of the cells may be partially filled with a thermal liquid (e.g., water) so as to effectively act as a vapor chamber and/or "heat pipe."

FIGS. 9 and 10 illustrate exemplary heat spreader formation processes, in accordance with a further embodiment of the invention. In the embodiment of FIGS. 9(*a*) and 9(*b*), the exemplary process 900 is illustrated for a simple 5-cell spreader structure having a center cell bordered by the other four cells. However, it will be appreciated that this example is simplified for illustrative purposes only, and that the process is applicable to a heat spreading device having a greater number of individual cells, such as those described above. In this particular embodiment, the heat spreading device is created by infiltrating a mold filled with thermally conductive particles, with different regions of the spreader having different fill materials, wherein the fill materials are initially separated by a frame. The frame (or cell walls) is "consumable" in this embodiment, meaning that they are absorbed into the other spreader materials during fabrication. FIG. 9(a) is a process flow diagram, while FIG. 9(b) illustrates the simplified cell structure of the heat spreading apparatus.

As particularly shown in block 902 of FIG. 9(a), the frame is extruded (e.g., using a material such as silver) and placed into a mold for infiltration of the individual cells. The center cell (or cells) is filled with a high $T_c$ material, such as high-grade diamond particles, as shown in block 904. In contrast, the border cells are filled with a lower $T_c$ material, such as silicon carbide, as shown in block 906. Then, the filled mold and source of bulk frame material (e.g., silver) is placed within a suitable heating apparatus, as shown in block 908. In block 910, the assembly is reflowed to as to infiltrate the particles within the mold. Additionally, with this particular embodiment, the frame walls are melted so as to form an amalgam with the fill materials. However, the tailored thermal profile of the apparatus is still preserved. Next, the assembly is cooled and removed from the mold, as shown in block 912, and any flash may be removed from the assembly by machining and/or surface finishing, as shown in block 914.

Finally, FIG. 10(a) illustrates an alternative process flow diagram 1000 similar to that of FIG. 9(a), only with the cell wall structure being maintained following cell material infiltration. In block 1002, the frame is extruded (e.g., using a material such as copper). The frame may also be chrome plated before being placed into a mold for infiltration of the individual cells. The center cell (or cells) is filled with a high $T_c$ material, such as high-grade diamond particles, as shown in block 1004. In contrast, the border cells are filled with a lower $T_c$ material, such as low-grade diamond particles, as shown in block 1006. Then, the filled mold and source of bulk frame material (e.g., copper) is placed within a suitable heating apparatus, as shown in block 1008. In block 1010, the assembly is reflowed to as to infiltrate the particles within the mold. Again, in this particular embodiment, the frame walls are not melted during the reflow. Next, the assembly is cooled and removed from the mold, as shown in block 1012, and any flash may be removed from the assembly by machining and/or surface finishing, as shown in block 1014.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming a heat spreading apparatus for semiconductor devices, the method comprising:
   extruding a frame material to form a plurality of individual cells;
   filling a first group of said individual cells with one or more high thermal conductivity materials;
   filling at least a second plurality of said individual cells with one or more materials of lower thermal conductivity than in said first plurality of said cells; and
   implementing a reflowing process following filling said plurality of individual cells so as to infiltrate said materials within said cells, wherein said defined walls of said frame material are absorbed into said materials within said cells following said reflowing.

2. The method of claim 1, wherein said plurality of individual cells are formed in at least one of a honeycomb-like arrangement and a packed arrangement.

3. The method of claim 2, wherein said individual cells are formed in at least one of a circular type shape and a polygonal type shape having three or more sides.

4. The method of claim 1, wherein said individual cells are configured with varying sizes according to said thermal profile.

5. The method of claim 1, wherein said frame material comprises one of more of: a metal material and a thermoplastic material.

* * * * *